United States Patent
Le Royer et al.

(10) Patent No.: US 12,550,404 B2
(45) Date of Patent: Feb. 10, 2026

(54) SEMICONDUCTOR DEVICE AND ASSOCIATED MANUFACTURING METHOD

(71) Applicant: COMMISSARIAT À L'ENERGIE ATOMIQUE ET AUX ÉNERGIES ALTERNATIVES, Paris (FR)

(72) Inventors: Cyrille Le Royer, Grenoble (FR); Louis Hutin, Grenoble (FR); Fabrice Nemouchi, Grenoble (FR); Nicolas Posseme, Grenoble (FR)

(73) Assignee: COMMISSARIAT À L'ENERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 392 days.

(21) Appl. No.: 17/577,743

(22) Filed: Jan. 18, 2022

(65) Prior Publication Data

US 2022/0231147 A1  Jul. 21, 2022

(30) Foreign Application Priority Data

Jan. 18, 2021 (FR) ..................................... 2100440

(51) Int. Cl.
  *H10D 64/01* (2025.01)
  *H10D 30/01* (2025.01)
  *H10D 86/00* (2025.01)

(52) U.S. Cl.
  CPC ....... *H10D 64/021* (2025.01); *H10D 30/0323* (2025.01); *H10D 86/201* (2025.01)

(58) Field of Classification Search
  CPC .. H01L 29/6656–66636; H01L 29/401; H10D 64/021; H10D 30/0323;
  (Continued)

(56) References Cited

U.S. PATENT DOCUMENTS

| | | | |
|---|---|---|---|
| 8,835,265 B1* | 9/2014 | Hsu | H01L 21/0217 438/299 |
| 2012/0313165 A1* | 12/2012 | Liu | H01L 29/66689 257/E21.409 |

(Continued)

FOREIGN PATENT DOCUMENTS

| | | |
|---|---|---|
| EP | 3 660 921 A1 | 6/2020 |
| WO | WO 2019/125501 A1 | 6/2019 |

OTHER PUBLICATIONS

Mäkinen, Thick-Film SOI Wafers: Preparation and Properties, 2010 (Year: 2010).*

(Continued)

*Primary Examiner* — Britt Hanley
*Assistant Examiner* — Casey Paul Boatman
(74) *Attorney, Agent, or Firm* — Pillsbury Winthrop Shaw Pittman LLP

(57) ABSTRACT

A semiconductor device includes a substrate; a plurality of gate stacks situated horizontally following one another on the substrate, each gate stack including a layer of a dielectric material in contact with the substrate and a layer of a conductive material on the layer of dielectric material; a source and a drain situated on the substrate on either side of the plurality of gate stacks; a plurality of first spacers made of a first dielectric material, called secondary spacers, having a first width, called width of the secondary spacers, the source and the drain being separated from the closest gate stack by a secondary spacer; at least one main spacer made of a second dielectric material, a main spacer being situated between each gate stack, the width of the main spacer(s) being greater than the width of the secondary spacers.

10 Claims, 5 Drawing Sheets

(58) Field of Classification Search
CPC .. H10D 30/402; H10D 30/014; H10D 86/201; H10D 48/3835
See application file for complete search history.

(56) References Cited

U.S. PATENT DOCUMENTS

| | | | |
|---|---|---|---|
| 2014/0120666 A1* | 5/2014 | Haensch | H01L 21/823814 257/E21.409 |
| 2014/0246736 A1* | 9/2014 | Chang | H01L 21/28158 257/411 |
| 2019/0043950 A1 | 2/2019 | George et al. | |
| 2019/0043953 A1* | 2/2019 | George | H01L 29/0692 |
| 2019/0043989 A1 | 2/2019 | Thomas et al. | |

OTHER PUBLICATIONS

Sarangan, Nanofabrication, 2016 (Year: 2016).*
Chen, A Cost Effective 32nm High-K/Metal Gate CMOS Technology for Low Power Applications with Single-Metal/Gate-First Process, 2008 (Year: 2008).*
KR Search Report as issued in French Patent Application No. 2100440, dated Oct. 7, 2021.

* cited by examiner

[Fig. 1]
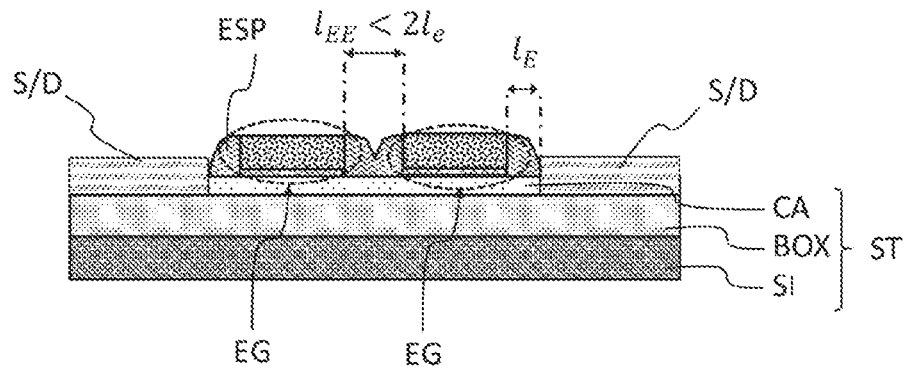
[Fig. 2]
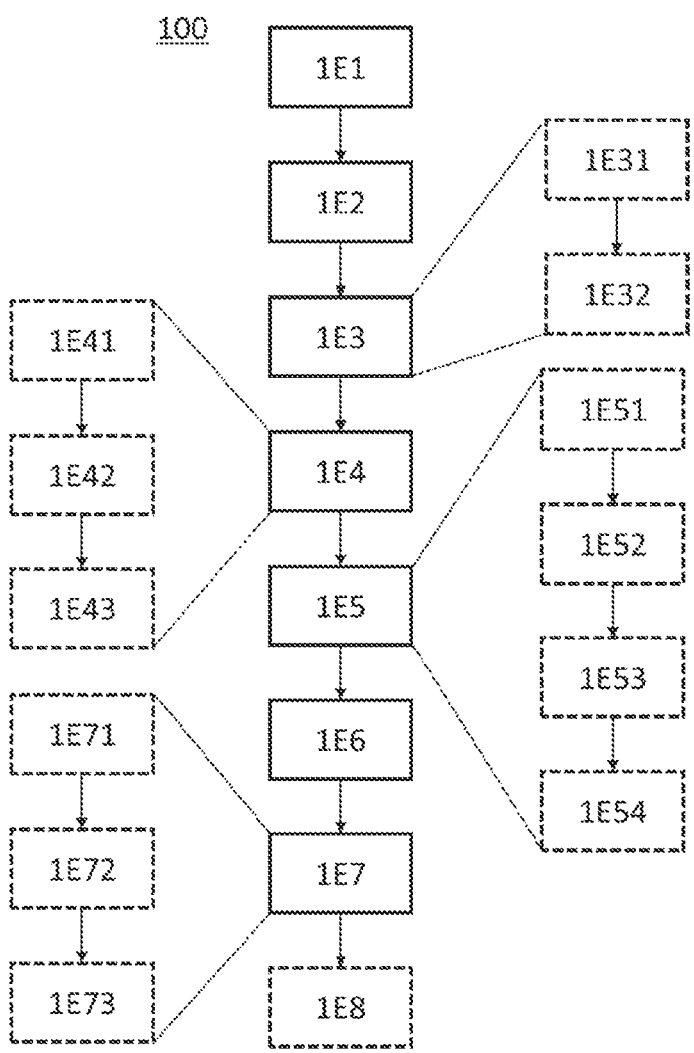

[Fig. 3]
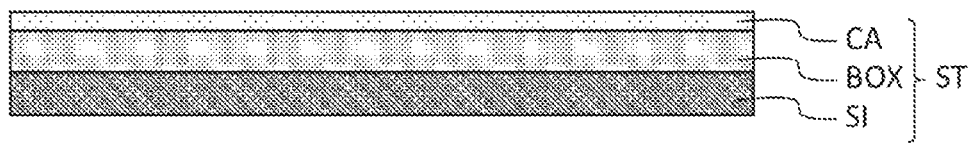
[Fig. 4]
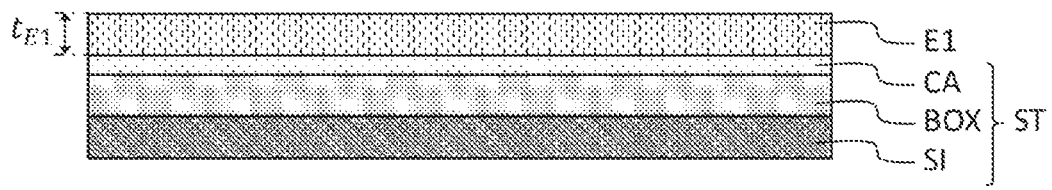
[Fig. 5]
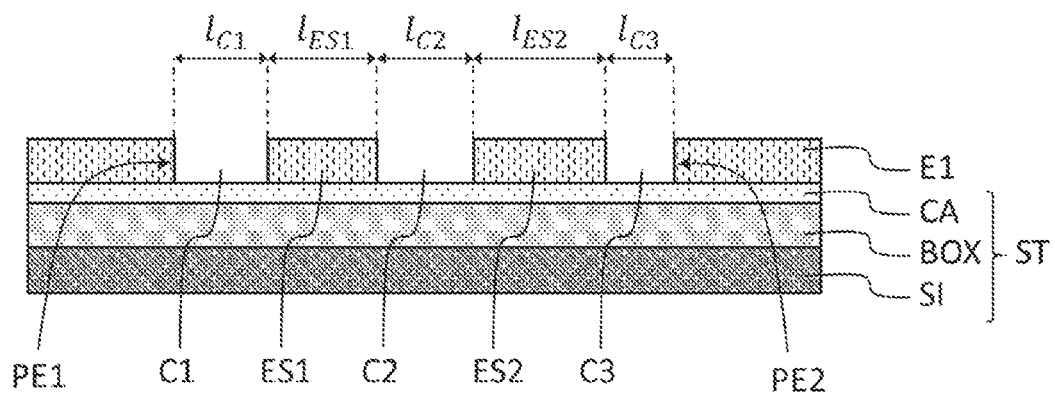

[Fig. 6]
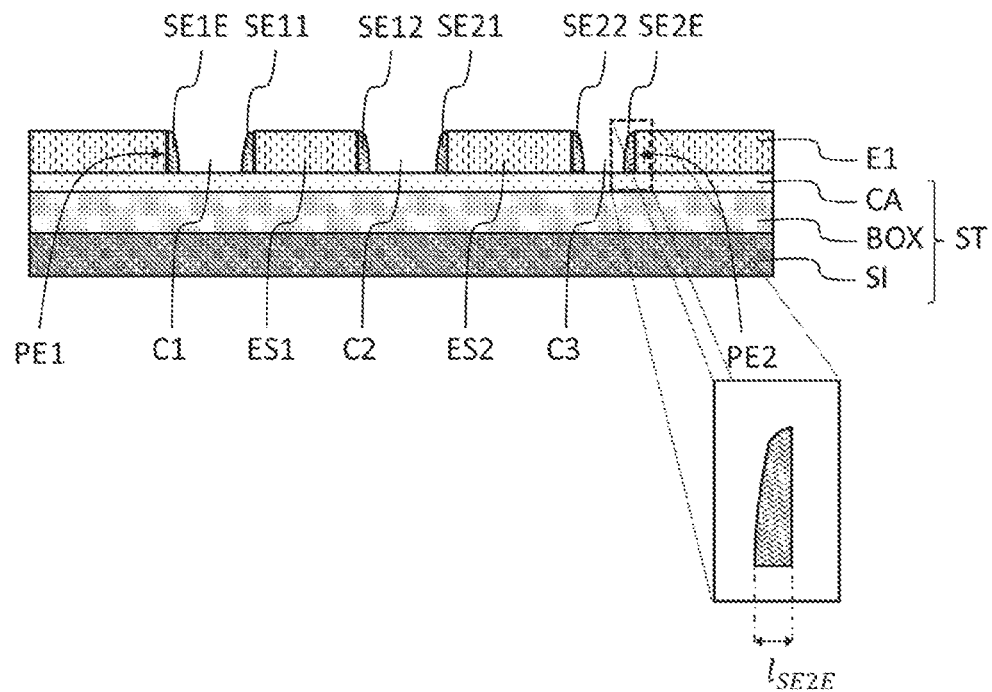
[Fig. 7]
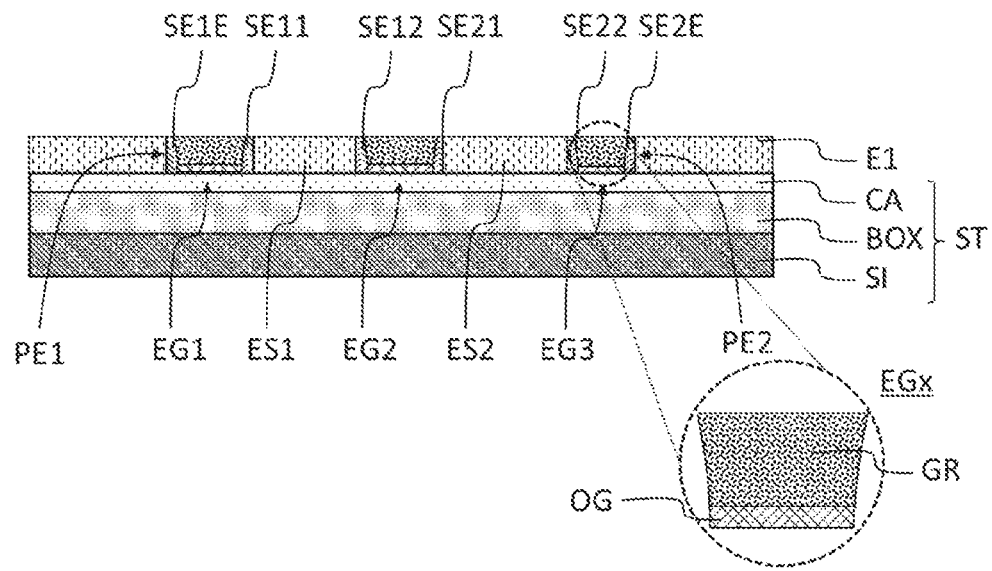

[Fig. 8]
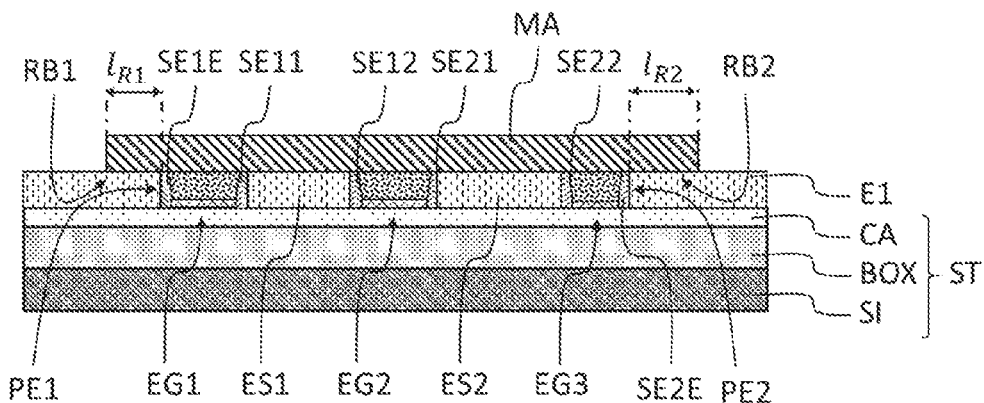
[Fig. 9]
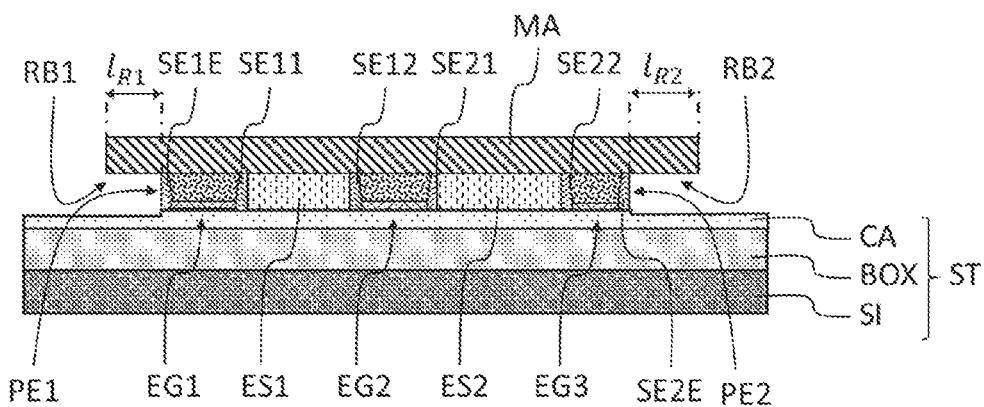
[Fig. 10]
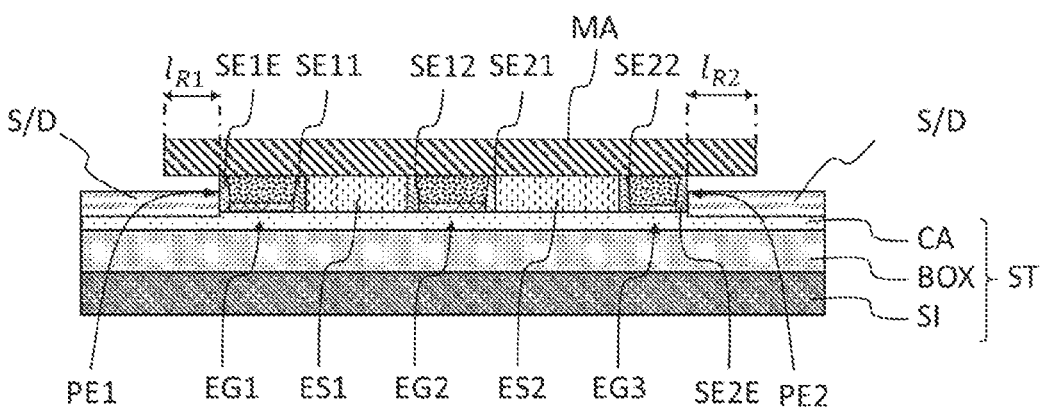

[Fig. 11]
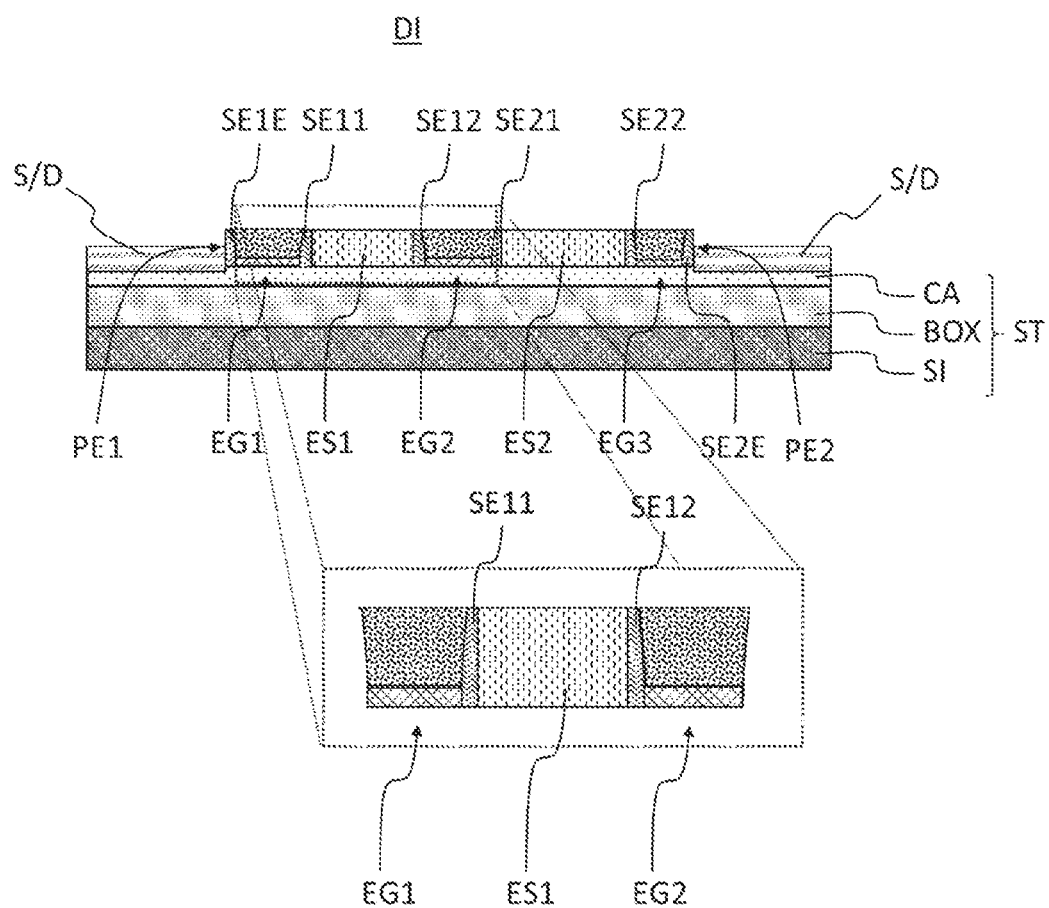

SEMICONDUCTOR DEVICE AND ASSOCIATED MANUFACTURING METHOD

CROSS REFERENCE TO RELATED APPLICATIONS

This application claims priority to French Patent Application No. 2100440, filed Jan. 18, 2021, the entire content of which is incorporated herein by reference in its entirety.

FIELD

The technical field of the invention is that of electronics, notably quantum electronics.

The present invention relates to a semiconductor device capable of being used as spin qbit (quantum bit) in a semiconductor material such as silicon.

BACKGROUND

In order to produce spin qbits, it is known to use a device comprising two gate stacks EG as well as a source and a drain S/D such as represented in FIG. 1. Each gate stack EG is surrounded by a spacer ESP of a given width $l_E$ such that a gate stack EG is separated from the source or the drain S/D by a width fixed by the width $l_E$ of this spacer ESP. In addition, the two gate stacks EG are separated by a distance $l_{EE}$ which cannot be less than two times the width of the spacer such that $l_{EE} < l_E$. Such a structure has however certain drawbacks.

Firstly, the source side and drain side S/D access is limited by the width $l_E$ of the spacer ESP. Yet, this width also fixes the maximum distance separating two gate stacks EG. There are thus few possibilities of optimisation between a good source side and drain side access and a sufficient distance between the two gate stacks EG. This also limits the density of devices that it is possible to produce on a wafer.

Next, in order to manipulate spin states in the structure, a radio frequency signal (for the writing phases, between 1 and 10 GHz—for the reading phases, around 100 MHz). Yet, parasitic capacitances between the gates or between a gate and the channel CA under the neighbouring gate are capable of disrupting the reading and writing operations. It is then necessary to compensate these disruptions, which increases the complexity of the manipulation or reading signals. Obviously, such parasitic capacitances could be reduced by increasing the distance $l_{EE}$ between the gate stacks EG, but this would also lead to an increase in the distance $l_E$ separating the source or the drain S/D from the closest gate stack EG, which would adversely affect good source side and drain side access.

There thus exists a need to provide a device in which the dimension of the separators between the gate stacks is not dictated by the dimension of the separators between the source or the drain and the gate stack which is the closest thereto, notably making it possible to increase the density of devices. There also exists the need to elaborate a method making it possible to obtain such a device.

SUMMARY

An aspect of the invention offers a solution to the aforementioned problems, by proposing a manufacturing method making it possible to decouple the choice of the dimensions of the spacers separating the gate stacks from the dimensions of the spacers separating the source or the drain from the gate stack that is the closest thereto.

One aspect of the invention relates to a method for manufacturing a semiconductor device from a substrate, the method comprising:
  a step of deposition, on the substrate, of a first layer of a dielectric material according to a first predetermined thickness;
  a step of etching a part of the first layer of a dielectric material over the totality of the first thickness defining, in the first layer of a dielectric material, a plurality of cavities separated by spacers, called main spacers, each cavity having a first side wall and a second side wall, the two side walls of cavities the furthest away from each other being designated by extreme walls;
  a step of deposition of a second layer of a dielectric material on the side walls of the cavities defined during the preceding etching step so as to define a plurality of secondary spacers on the main spacers and the extreme walls;
  a step of creating, in each cavity, a gate stack comprising a third layer of a dielectric material in contact with the substrate and a fourth layer of a conductive material on the third layer of a dielectric material, the gate stack thus created having a height greater than or equal to the first thickness;
  a step of creating a hard mask, said hard mask entirely covering the gate stacks as well as the main and secondary spacers;
  a step of etching the part of the first layer of a dielectric material not protected by the hard mask, the etching being carried out over the totality of the first thickness;
  a step of creating a source-drain module in the zones left free by the part of the first layer etched during the preceding etching step.

Thanks to the method according to an aspect of the invention, it is possible to decorrelate the dimension of the spacer situated between the source or the drain and the closest gate stack from the dimension of each spacer separating two successive gate stacks. It is further possible to choose different sizes of separator between the gate stacks such that a first gate stack of the device could be separated from a second gate stack by a first spacer having a first width whereas the second gate stack will be separated from a third gate stack by a second spacer having a width that can be different from the first width.

Apart from the characteristics that have been mentioned in the preceding paragraph, the method according to a first aspect of the invention may have one or more complementary characteristics among the following, considered individually or according to all technically possible combinations thereof.

In an embodiment, the method further comprises a step of removal of the hard mask.

In an embodiment, the hard mask forms with each extreme wall an edge.

In an embodiment, the step of deposition of a second layer of a dielectric material on the side walls of the cavities comprises:
  a sub-step of deposition of a layer of a dielectric material; and
  a sub-step of etching the second layer of a dielectric material so as to leave the second layer of a dielectric material only on the side walls of the cavities.

In an embodiment, the step of creating, in each cavity, a gate stack comprises:
  a sub-step of deposition or growth of the third layer of a dielectric material on the substrate;

a sub-step of deposition of the fourth layer of a conductive material on the third layer of a dielectric material; and a sub-step of chemical mechanical polishing such that the height of the gate stack is equal to the first thickness.

In an embodiment, the step of creating a hard mask comprises:
- a sub-step of deposition of a layer intended to form the hard mask;
- a sub-step of lithography so as to define the zone forming the hard mask;
- a sub-step of etching the layer intended to form the hard mask as a function of the zone defined during the lithography sub-step; and
- a sub-step of stripping so as to define the hard mask.

In an embodiment, the step of creating a source-drain module comprises:
- a sub-step of selective growth of a layer of silicon in the zone left free by the part of the first layer etched during the preceding step;
- a sub-step of doping the layer of silicon thus deposited;
- a sub-step of activation of the dopants.

In an embodiment, the substrate is an SOI (Silicon On Insulator) type substrate.

A second aspect of the invention relates to a semiconductor device capable of being obtained by means of a method according to a first aspect of the invention. More specifically, the device according to a second aspect of the invention comprises:
- a substrate;
- a plurality of gate stacks situated horizontally following one another on the substrate, each gate stack comprising a layer of a dielectric material in contact with the substrate and a layer of a conductive material on the layer of a dielectric material;
- a source and a drain situated on the substrate on either side of the plurality of gate stacks;
- a plurality of first spacers made of a first dielectric material, called secondary spacers, having a first width identical for all the secondary spacers, called width of the secondary spacers, the source and the drain being separated from the closest gate stack by a secondary spacer;
- at least one main spacer made of a second dielectric material, two secondary spacers and a main spacer intercalated between the two secondary spacers being situated between each gate stack.

Apart from the characteristics that have been mentioned in the preceding paragraph, the device according to a second aspect of the invention may have one or more complementary characteristics among the following, considered individually or according to all technically possible combinations thereof.

In an embodiment, the width of the main spacer(s) is greater than the width of the secondary spacers.

In an embodiment, the device comprises at least two gate stacks.

In an embodiment, the source and the drain are raised compared with the substrate.

In an embodiment, the source and the drain are separated from the closest gate stack by a unique secondary spacer.

The invention and the different applications thereof will be better understood on reading the description that follows and by examining the figures that accompany it.

BRIEF DESCRIPTION OF THE FIGURES

The figures are presented for indicative purposes and in no way limit the invention.

FIG. 1 shows a device according to the prior art.

FIG. 2 shows a flowchart of a manufacturing method according to a first aspect of the invention, the steps in dotted lines being relative to particular embodiments.

FIG. 3 shows an SOI type substrate capable of being used in a method according to a first aspect of the invention.

FIG. 4 shows a step of deposition of a first layer of a dielectric material according to the invention.

FIG. 5 shows a step of etching the first layer of a dielectric material according to the invention.

FIG. 6 shows a step of deposition of a second layer of a dielectric material on the side walls of the cavities according to the invention.

FIG. 7 shows a step of creating, in each cavity, a gate stack according to the invention.

FIG. 8 shows a step of creating a hard mask according to the invention.

FIG. 9 shows a step of etching the part of the first layer of a dielectric material not protected by the hard mask according to the invention.

FIG. 10 shows a step of creating a source-drain module according to the invention.

FIG. 11 shows a device obtained by means of a method according to the invention.

DETAILED DESCRIPTION

Unless stated otherwise, a same element appearing in the different figures has a single reference. Hereafter, when several references only differ by their numerical indices, for example C1 and C2, reference could be made to all of these references by replacing their numerical indices by the letter x, for example Cx. Furthermore, the different elements will be described such as they appear in a sectional plane perpendicular to the surface of the substrate on which the method is implemented (or the device produced), the alignment axis of the gate stacks being comprised in this sectional plane.

A first aspect of the invention illustrated in FIG. 2 relates to a method 100 for manufacturing a semiconductor device from a substrate ST. In an embodiment, the substrate is a SOI (Silicon On Insulator) type substrate such as illustrated in FIG. 3 comprising a layer of silicon SI, a buried oxide (BOX) layer on the layer of silicon SI and a second layer of silicon CA, this second layer of silicon CA being capable of forming a transistor channel.

The method 100 according to the invention comprises a step 1E1 of deposition, on the substrate ST, of a first layer E1 of a dielectric material according to a first predetermined thickness $t_{E1}$. This step 1E1 is illustrated in FIG. 4. In an embodiment, the dielectric material of the first layer E1 is a material having a low dielectric constant, for example a dielectric constant less than or equal to $4\varepsilon_0$. In an embodiment, the material of the first layer E1 of a dielectric material is silicon oxide ($SiO_2$). In an embodiment, the predetermined thickness $t_{E1}$ is chosen such that 40 nm$\leq t_{E1} \leq$100 nm. More generally, the predetermined thickness is chosen as a function of the desired gate height, this gate height being, as is described hereafter, a function of this predetermined thickness $t_{E1}$.

The method 100 according to the invention next comprises a step 1E2 of etching a part of the first layer E1 of a dielectric material over the totality of the first thickness $t_{E1}$ so as to define a plurality of cavities Cx (that is to say at least two cavities Cx) separated by spacers ESx, called main spacers. Thus, each cavity Cx is defined by a first side wall and a second side wall of two main spacers ESx. When a cavity is situated between a first main spacer ESx and a second main spacer ESx, then the first side wall is a side wall of the first main spacer ESx and the second side wall is a side wall of the second main spacer ESx. Furthermore, it is possible to distinguish two particular cavity walls Cx that cannot be associated with any main spacer ESx because situated at the two extremes of the succession of cavities Cx and which correspond to the side walls of the first layer E1 of a dielectric material. Hereafter, as illustrated in FIG. 5, these two cavity walls Cx the farthest away from each other are designated extreme side walls PE1, PE2.

Several parameters may be associated with this step and notably the width of the main spacers ESx (in other words, the distance separating each cavity Cx), noted $l_{ESi}$ in FIG. 5 with i the index of the considered spacer ESx, and the width of each cavity, noted $l_{Cj}$ in FIG. 5 with j the index of the considered cavity Cx. Each cavity Cx thus formed being destined to receive a gate stack EGx (cf. FIG. 6 described hereafter), the width $l_{Cj}$ of each cavity defines the width of the gate stack EGx and the distance $l_{ESi}$ separating each cavity defines the width of the main spacers ESx separating each gate stack EGx. In an embodiment, this step 1E2 may be implemented by means of a DUV lithography, for example a DUV (deep UV) method by immersion, or instead by means of electron lithography, followed by an etching and a step of removal of the resin, for example by stripping. Other solutions known to those skilled in the art may obviously be envisaged.

This step 1E2 is illustrated in FIG. 5 in the case of three cavities Cx. The first cavity C1 has a width $l_{C1}$, the second cavity C2 has a width $l_{C2}$ and the third cavity has a width $l_{C3}$. Further, in the illustration of FIG. 5, the widths are such that $l_{C1} \neq l_{C2} \neq l_{C3}$. However, the method 100 according to the invention enables great flexibility in the choice of these dimensions and other relationships between the widths of the cavities may be envisaged, for example the widths of the three cavities Cx could be identical. In addition, in the example of FIG. 5, the first cavity C1 and the second cavity C2 are separated by a first main spacer ES1 of width $l_{ES1}$ whereas the second cavity C2 and the third cavity C3 are separated by a second main spacer ES2 of width $l_{ES2}$. In the illustration of FIG. 5, $l_{ES1} \neq l_{ES2}$, but, as has already been mentioned, the method 100 according to the invention enables great flexibility in the choice of these dimensions and other relationships between the widths of the main spacers ESx may be envisaged, for example the widths of the two main spacers IESx could be identical.

The method 100 according to the invention next comprises a step 1E3 of deposition of a second layer SExx of a dielectric material on the side walls of the main spacers ESx defined during step 1E2 of etching the first layer E1 of a dielectric material as well as on the extreme walls PE1, PE2 (in other words, on all the side walls defining each cavity Cx) so as to define a plurality of secondary spacers SExx. In an embodiment, the dielectric material of the second layer SExx is a material with low dielectric constant (for example, less than or equal to $4\varepsilon_0$), such as silicon oxycarbide SiCO or instead SiBCN. In an embodiment, the width $l_{SExx}$ of the layer of dielectric material at the base of each spacer ESx (that is to say at the bottom of each cavity Cx) is comprised between 3 nm and 15 nm, beneficially equal to 10 nm.

This step 1E3 is illustrated in FIG. 6 in the case of three cavities Cx. At the end of this step 1E3, a first extreme secondary spacer SE1E is formed at the level of the first extreme wall PE1 and a second extreme secondary spacer SE2E is formed at the level of the second extreme wall PE2. In addition, a secondary spacer SExx is formed on each wall of each spacer ESx. Thus, the walls of the first main spacer ES1 are covered with a layer of a dielectric material forming a first secondary spacer SE11 and a second secondary spacer SE12. The same is true for the second main spacer ES2.

In an embodiment, the step 1E3 of deposition of a second layer SExx of a dielectric material on the side walls of the main spacers and the extreme walls PE1, PE2 (in other words on the side walls of the cavities Cx) comprises a first sub-step 1E31 of deposition of a second layer of a dielectric material. This second layer is going to cover the side walls of the main spacers ESx and the extreme side walls PE1, PE2 as well as the bottom of each cavity Cx defined during step 1E2 of etching the first layer E1 of a dielectric material. In order to remove the layer thus deposited at the bottom of each cavity Cx, the step 1E3 of deposition of a second layer SExx of a dielectric material on the side walls of the main spacers ESx and the extreme walls PE1, PE2 also comprises a sub-step 1E32 of etching the second layer of a dielectric material, the etching being carried out so as to leave the second layer of dielectric material only on the walls of the main spacers ESx and the extreme walls PE1, PE2 (or in a equivalent manner on the side walls of the cavities Cx).

In an embodiment, this etching sub-step 1E32 is an anisotropic etching sub-step, for example a plasma etching (reactive ion etching). Generally speaking, the use of an etching sub-step 1E32 produces a layer SExx such as illustrated in the box of FIG. 6, that is to say a layer of which the thickness increases on approaching the base of the considered spacer SExx (in other words the bottom of the considered cavity Cx). Shapes other than that shown in FIG. 6 may however be envisaged.

The method 100 according to the invention next comprises a step 1E4 of creating, in each cavity Cx, a gate stack EGx comprising a third layer OG of a dielectric material in contact with the substrate ST and a fourth layer GR of a conductive material on the third layer OG of a dielectric material, the gate stack EGx thus created having a height greater than or equal to the first thickness. In an embodiment, the fourth layer GR of a conductive material is a layer of polysilicon or metal such as TiN. In an embodiment, the third layer OG of a dielectric material is a layer of $SiO_2$, for example obtain by plasma oxidation or, desirably, by thermal oxidation, the latter technique making it possible to obtain an oxide of better quality. In an embodiment, the thickness of the third layer OG of a dielectric material is comprised between 2 nm and 10 nm, in an embodiment equal to 6 nm.

This step 1E4 is illustrated in FIG. 7 in the case of three gate stacks EGx. Starting from the right, the first gate stack EG1 is separated from the second gate stack EG2 by the succession of three spacers: the first secondary spacer SE11 from the first main spacer ES1, the first main spacer ES1 and the second secondary spacer SE12 from the first main spacer ES1. A same succession of spacers separates the second gate stack EG2 from the third gate stack EG3.

In an embodiment, the step 1E4 of creating, in each cavity Cx, a gate stack EGx comprises a sub-step 1E41 of deposition or growth of a third layer OG of a dielectric material on the substrate ST. In an embodiment, this sub-step 1E41 is carried out by thermal or plasma oxidation of the silicon situated at the bottom of each cavity Cx. The step 1E4 of creating a gate stack EGx next comprises a sub-step 1E42 of deposition of a fourth layer GR of a conductive material on the third layer OG of a dielectric material, for example polysilicon and/or a metal such as TiN, the total thickness deposited during this sub-step 1E42 being greater than the height $t_{E1}$ of the cavities Cx, desirably much greater (that is to say more than 20%) than the height $t_{E1}$ of the cavities Cx. The step 1E4 of creating a gate stack EGx next comprises a sub-step 1E43 of chemical mechanical polishing (CMP) such that the gate stack EGx thus obtained has a height equal to the first thickness. In particular, the chemical mechanical polishing sub-step 1E43 makes it possible to control in a precise manner the final height of the gate stacks EGx, for example to reduce the aforementioned parasitic capacitances.

In addition, the method 100 according to the invention comprises a step 1E5 of creating a hard mask MA, said hard mask MA entirely covering the gate stacks EG as well as the main ESx and secondary SExx spacers. In an embodiment, the material of the hard mask MA is SiN. In an embodiment, the thickness of the hard mask MA is comprised between 40 nm and 100 nm.

In an embodiment, the hard mask MA forms with each extreme wall PEx an edge RBx. It is possible to define a width for each edge RBx as the distance separating an extreme wall PEx from the vertical surface of the hard mask MA the closest to the considered extreme wall PEx. In an embodiment, the width of each edge RBx is less than 30 nm, or even 15 nm.

This step 1E5 is illustrated in FIG. 8. In this figure, the first extreme wall PE1 forms with the hard mask MA a first edge RB1 of width $l_{R1}$. Similarly, the second extreme wall PE2 forms with the hard mask MA a second edge RB2 of width $l_{R2}$. The hard mask MA thus deposited protects the gate stacks EGx as well as the main ESx and secondary SExx spacers, but leaves the extreme zones (that is to say the zones not situated between the two extreme walls PEx) exposed.

In an embodiment, the step 1E5 of creating a hard mask MA comprises a sub-step 1E51 of deposition of a layer intended to form the hard mask MA. This step 1E5 next comprises a sub-step of lithography 1E52 so as to define the zone forming the mask, a sub-step 1E53 of etching as a function of the zone defined during the preceding lithography sub-step and a sub-step 1E54 of stripping so as to define the hard mask MA.

The method 100 according to the invention next comprises a step 1E6 of etching the part of the first layer E1 of a dielectric material not protected by the hard mask MA over the totality of the first thickness $t_{E1}$. It is useful to note that, when an edge RBX is formed between the hard mask MA and the extreme walls PE1, PE2, the etching step 1E6 is an anisotropic etching step 1E6 and the part situated under each edge RBx is not a zone protected by the hard mask MA. Also, the etching also takes place under each edge RBx.

In an embodiment, this etching step 1E6 is carried out by means of highly selective wet etching so as to etch preferentially the material of the first layer E1 of a dielectric material. Highly selective is taken to mean an etching for which the rate of etching for the material of the first layer E1 of a dielectric material is at least ten times greater than the rates of etching of the other materials present. In an embodiment, the hard mask is made of silicon nitride (SiN), the first layer E1 of a dielectric material is deposited on silicon and hydrofluoric acid (e.g. 1% HF by volume) is used to carry out the etching of the first layer E1 of a dielectric material.

This step is illustrated in FIG. 9. In this figure, the part of the first layer E1 of a dielectric material not protected by the hard mask MA has been etched over the totality of the first thickness $t_{E1}$ thus exposing the surface of the substrate ST. The etching being selective, the first extreme secondary spacer SE1E and the second extreme secondary spacer SE2E have not been etched (at least not in a significant manner).

The method finally comprises a step 1E7 of creating a source-drain module S/D in the zones left free by the part of the first layer E1 of a dielectric material etched during the preceding step 1E6.

This step 1E7 is illustrated in FIG. 10. In this figure, the newly created source and the drain S/D are in contact with the surface of the substrate ST, here in contact with the second layer CA of silicon of the SOI substrate, the latter being capable of forming a transistor channel. In addition, each source/drain is separated from the adjoining gate stack EG1, EG3 by a unique secondary extreme spacer SE1E, SE2E.

In an embodiment, the step 1E7 of creating the source-drain module S/D comprises a sub-step 1E71 of selective growth, for example by epitaxy, of a layer of silicon in the zone left free by the part of the first layer E1 etched during the preceding step 1E6. The deposition may be carried out with the formation of facet and/or with in situ doping. Selective growth is taken to mean that the rate of growth of the material on the surface of the substrate (here the second layer CA of silicon of the SOI substrate) is much greater than the rate of growth of the same material on the other surfaces present (notably the hard mask MA or the unique secondary extreme spacers SE1E, SE2E—for example 10 times greater). Thus, the source and the drain are raised compared with the substrate ST, and more precisely, on the figures, the silicon layer CA, which presents benefits from the charge carrier standpoint.

The step 1E7 of creating the source-drain module S/D comprises a sub-step 1E72 of doping the layer of silicon thus deposited followed by a sub-step 1E73 of annealing for activation. It is interesting to note here that the presence of the hard mask MA eliminates the risk of doping zones between the gate stacks EGx, which makes it possible to decrease the height of said stacks EGx. Further, the source S and the drain D being separated from the closest gate stack EGx by a unique secondary spacer SExE, the distance separating the source or the drain S/D from the gate stack EG1, EG3 that is closest thereto is controlled in a precise manner, the latter being fixed by the width of the unique secondary extreme spacers SExE. In addition, this step of creating the source-drain module S/D may be co-integrated in a conventional CMOS method.

In an embodiment, the method also comprises a step 1E8 of removal of the hard mask MA, for example by means of wet etching such as etching with $H_3PO_4$.

The device DI obtained at the end of this step is illustrated in FIG. 11. As illustrated in the box of FIG. 11 for the first gate stack EG1 and the second gate stack EG2, the device DI comprises a plurality of gate stacks EGx, each gate stack EGx being separated from the following/preceding gate stack EGx by three spacers: two secondary spacers SExx of which the width is identical whatever the considered pair of gate stacks EGx and a main spacer ESx of which the width can vary as a function of the considered pair of gate stacks EGx. Thus, an alternance of thin (secondary SExx)/thick (main ESx)/thin (secondary SExx) spacers is obtained between each gate stack when the width of the main spacer ESx is greater than the width of the secondary spacers SExx. In general, but not in a limiting manner, a spacer forms a ring around the gate stack EGx, with a closed contour. The sectional drawings show two parts of spacer on either side of the flanks of the gate stack EGx. By extension, these two spacer parts may be designated by "the spacers". Furthermore, the invention extends to embodiments in which at least two discontinuous spacers flank the gate stack EGx.

Also, a second aspect of the invention relates to a semiconductor device DI capable of being obtained by a method 100 such as described previously. Such a device DI comprises a substrate ST, for example an SOI type substrate such as described previously. The device also comprises a plurality of gate stacks EGx situated horizontally following one another horizontally on the substrate ST, each gate stack EGx comprising a layer OG of a dielectric material in contact with the substrate ST and a layer GR of a conductive material on the layer OG of a dielectric material. The device DI also comprises a source and a drain S/D situated on the substrate ST on either side of the plurality of gate stacks EGx. The device DI further comprises a plurality of first spacers SExx made of a first dielectric material, called secondary spacers SExx, having a first width that is identical for all the secondary spacers SExx, called width of the secondary spacers, the source and the drain S/D being separated from the closest gate stack EGx by a secondary spacer, called unique secondary extreme spacer SExE. The device DI also comprises at least one main spacer ESx made of a second dielectric material, two secondary spacers SExx and a main spacer ESx intercalated between the two secondary spacers SExx being situated between each gate stack EGx, the width of the main spacer ESx being greater than the width of the secondary spacers SExx. In an embodiment, the first dielectric material of the secondary spacers SExx is different from the second dielectric material of the main spacers ESx. In an embodiment, the first dielectric material and the second dielectric material are materials having a low dielectric constant. In an embodiment, the thickness of the substrate ST (in particular, on the figures, the silicon layer CA) between the two unique secondary extreme spacer SExE is constant, the integrity of the layer in which is formed the active part of the device DI being preserved. Such a device DI is particularly beneficial for quantum electronics, in particular for obtaining spin qbits in a semiconductor material such as silicon.

It will be appreciated that the various embodiments described previously are combinable according to any technically permissible combinations.

The invention claimed is:

1. A method for manufacturing a semiconductor device from a substrate, said method comprising:
   a step of deposition, on the substrate, of a first layer of a dielectric material according to a first predetermined thickness;
   a step of etching a part of the first layer of a dielectric material over the totality of the first thickness defining, in the first layer of a dielectric material, a plurality of cavities separated by main spacers, each cavity having a first side wall and a second side wall, the first and second side walls of cavities the farthest away from each other being designated by w walls;
   a step of deposition of a second layer of a dielectric material on the side walls of the cavities defined during the preceding step of etching, so as to define a plurality of secondary spacers on the main spacers and the extreme walls;
   a step of creating, in each cavity, a gate stack comprising a third layer of a dielectric material in contact with the substrate and a fourth layer of a conductive material on the third layer of the dielectric material, the gate stack thus created having a height greater than or equal to the first thickness;
   a step of creating a hard mask, said hard mask entirely covering the gate stacks as well as the main and secondary spacers;
   a step of etching the part of first layer of a dielectric material not protected by the hard mask, the etching being carried out over the totality of the first thickness;
   a step of creating a source-drain module comprising a source and a drain in the zones left free by the part of the first layer etched during the preceding step of etching the part of first layer of a dielectric material not protected by the hard mask, the source and the drain each being separated from a corresponding closest gate stack of the gate stacks by only one secondary spacer of the plurality of secondary spacers, a distance separating the source and the drain from each corresponding closest gate stack corresponding to a width of said only one secondary spacer.

2. The method according to claim 1, further comprising a step of removal of the hard mask.

3. The method according to claim 1, wherein the hard mask forms with each extreme wall an edge.

4. The method according to claim 1, wherein the step of deposition of a second layer of a dielectric material on the side walls of the cavities comprises:
   a sub-step of deposition of a layer of a dielectric material; and
   a sub-step of etching the second layer of a dielectric material so as to leave the second layer of a dielectric material only on the side walls of the cavities.

5. The method according to claim 1, wherein the step of creating, in each cavity, a gate stack comprises:
   a sub-step of deposition or growth of the third layer of a dielectric material on the substrate;
   a sub-step of deposition of the fourth layer of a conductive material on the third layer of a dielectric material; and
   a sub-step of chemical mechanical polishing such that the gate stack has a height equal to the first thickness.

6. The method according to claim 1, wherein the step of creating a hard mask comprises:
   a sub-step of deposition of a layer intended to form the hard mask;
   a sub-step of lithography so as to define the zone forming the hard mask;
   a sub-step of etching the layer intended to form the hard mask as a function of the zone defined during the lithography sub-step; and
   a sub-step of stripping so as to define the hard mask.

7. The method according to claim 1, wherein the step of creating a source-drain module comprises:
   a sub-step of selective growth of a layer of silicon in the zone left free by the part of the first layer etched during the preceding step of etching the part of first layer of a dielectric material not protected by the hard mask;
   a sub-step of doping the layer of silicon thus deposited;
   a sub-step of activation of the dopants.

8. The method according to claim 1, wherein the substrate is an SOI type substrate.

9. A method for manufacturing a semiconductor device from a substrate, said method comprising:
   a step of deposition, on the substrate, of a first layer of a dielectric material according to a first predetermined thickness;
   a step of etching a part of the first layer of a dielectric material over the totality of the first thickness defining, in the first layer of a dielectric material, a plurality of cavities separated by main spacers, each cavity having a first side wall and a second side wall, the first and second side walls of cavities the farthest away from each other being designated by extreme walls;

a step of deposition of a second layer of a dielectric material on the side walls of the cavities defined during the preceding step, so as to define a plurality of secondary spacers on the main spacers and the extreme walls;

a step of creating, in each cavity, a gate stack comprising a third layer of a dielectric material in contact with the substrate that is not a high-k dielectric material and a fourth layer of a conductive material on the third layer of the dielectric material, the gate stack thus created having a height greater than or equal to the first thickness;

a step of creating a hard mask, said hard mask entirely covering the gate stacks as well as the main and secondary spacers;

a step of etching the part of first layer of a dielectric material not protected by the hard mask, the etching being carried out over the totality of the first thickness, and a step of creating a source-drain module in the zones left free by the part of the first layer etched during the preceding etching step.

10. The method according to claim 1, wherein a width of the main spacer is greater than a width of each of the secondary spacers.

* * * * *